(12) United States Patent
Lee et al.

(10) Patent No.: US 11,619,850 B2
(45) Date of Patent: Apr. 4, 2023

(54) DISPLAY DEVICE

(71) Applicant: Samsung Display Co., Ltd., Yongin-Si (KR)

(72) Inventors: Yong Hee Lee, Suwon-si (KR); Dong Hee Shin, Asan-si (KR); Geun Ho Lee, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 99 days.

(21) Appl. No.: 17/099,230

(22) Filed: Nov. 16, 2020

(65) Prior Publication Data

US 2021/0373398 A1 Dec. 2, 2021

(30) Foreign Application Priority Data

May 26, 2020 (KR) .................... 10-2020-0063130

(51) Int. Cl.
*G02F 1/1368* (2006.01)
*G02F 1/1362* (2006.01)
*G02F 1/1343* (2006.01)
*H01L 27/12* (2006.01)

(52) U.S. Cl.
CPC ...... *G02F 1/136259* (2013.01); *G02F 1/1368* (2013.01); *G02F 1/134309* (2013.01); *G02F 1/136209* (2013.01); *G02F 1/136286* (2013.01); *H01L 27/1244* (2013.01); *G02F 2201/123* (2013.01)

(58) Field of Classification Search
CPC ............ G02F 1/136286; G02F 1/1368; G02F 2201/123; G02F 1/134309; G02F 1/136213; G02F 1/136218; H01L 27/1244
See application file for complete search history.

(56) References Cited

U.S. PATENT DOCUMENTS

| | | | |
|---|---|---|---|
| 2012/0001840 A1* | 1/2012 | Ohgami | G02F 1/134309 345/92 |
| 2014/0111504 A1* | 4/2014 | Lee | G02F 1/134363 445/24 |

FOREIGN PATENT DOCUMENTS

| | | |
|---|---|---|
| KR | 10-0669742 B1 | 1/2007 |
| KR | 10-2011-0043166 A | 4/2011 |
| KR | 10-2015-0023096 A | 3/2015 |
| KR | 10-1675372 B1 | 11/2016 |
| KR | 10-1849567 B1 | 4/2018 |
| KR | 10-2019-0141510 A | 12/2019 |

* cited by examiner

*Primary Examiner* — James A Dudek
(74) *Attorney, Agent, or Firm* — Innovation Counsel LLP

(57) ABSTRACT

According to an exemplary embodiment, a display device includes: a plurality of gate lines; a plurality of data lines; and a plurality of pixels connected to the gate lines and the data lines, wherein each of the pixels includes: a transistor configured to include a gate electrode, a first electrode, a second electrode, and a channel semiconductor; a pixel electrode connected to the second electrode and including a plurality of fine branch portions and a connector connected to the second electrode; and a target pattern overlapping a fine slit dispose between adjacent fine branch portions. At least one of the adjacent fine branch portions is directly connected to the connector.

17 Claims, 5 Drawing Sheets

DISPLAY DEVICE

CROSS-REFERENCE TO RELATED APPLICATION

This application claims priority to and benefits of Korean Patent Application No. 10-2020-0063130, filed in the Korean Intellectual Property Office on May 26, 2020, the entire contents of which are incorporated herein by reference.

BACKGROUND

(a) Field

Embodiments of the present inventive concept relates to a display device, and more particularly, to a display device capable of repairing defective pixels.

(b) Description of the Related Art

A liquid crystal display is one of most widely used display devices. The liquid crystal display is a device that includes a display panel in which electrodes are formed and a liquid crystal layer, rearranges of the liquid crystal layer by applying a voltage to the electrodes, and adjusts light transmittance through the rearrangement of liquid crystal molecules to display an image.

A plurality of pixel electrodes, a plurality of gate lines, a plurality of data lines, and a plurality of storage electrode lines may be formed in the display panel. A gate signal may be applied to a plurality of pixels through the gate lines, a data voltage may be applied to the pixels through the data lines, and a common voltage may be applied to the pixels through the storage electrode lines.

Such wires may be arranged to cross each other in the display panel, and a short circuit may occur between the wires intersecting each other. When a short circuit occurs between different wires, a defect may occur in which a pixel connected to the corresponding wire cannot display an image with normal luminance.

The above information disclosed in this Background section is only for enhancement of understanding of the background of the inventive concept, and therefore it may contain information that does not form the prior art that is already known in this country to a person of ordinary skill in the art.

SUMMARY

Embodiments of the present inventive concept has been made in an effort to provide a display device capable of accurately repairing a defective pixel that cannot display an image with normal luminance.

An exemplary embodiment of the present inventive concept provides a display device including: a plurality of gate lines; a plurality of data lines; and a plurality of pixels connected to the plurality of gate lines and the plurality of data lines, wherein each of the plurality of pixels includes: a transistor including a gate electrode, a first electrode, a second electrode, and a channel semiconductor; a pixel electrode connected to the second electrode and including a plurality of fine branch portions and a connector connected to the second electrode; and a target pattern overlapping a fine slit disposed between adjacent fine branch portions, wherein at least one of the adjacent fine branch portions is directly connected to the connector.

The target pattern partially may overlap the adjacent fine branch portions that are directly connected to the connector.

The target pattern may be disposed at a same layer as the plurality of gate lines and the gate electrode, and is physically and electrically separated from the plurality of gate lines and the gate electrode.

The target pattern may be a floating pattern that is insulated from any other conductor.

The target pattern may have a size of 6 μm or less along a first direction and 6 μm or less along a second direction.

The target pattern may be exposed by the fine slit in a plan view.

The pixel electrode may further include a horizontal stem portion and a vertical stem portion, and the adjacent fine branch portions that are directly connected to the connector are disposed between the connector and the vertical stem portion.

The display device may further include a light blocking member covering the plurality of gate lines, the plurality of data lines, the gate electrode, the first electrode, the second electrode, and the channel semiconductor, and the target pattern may be disposed in a pixel area defined by the light blocking member.

The target pattern may be spaced by a predetermined distance apart from the light blocking member along a first direction and a second direction in a plan view.

A portion of the first electrode may extend from a data line along a first direction, and the target pattern is disposed on an extension line connecting a center of the pixel electrode and a portion of the first electrode.

An exemplary embodiment of the present inventive concept provides a display device including: a gate line extending along a first direction; a data line extending along a second direction; a first electrode including a portion extending along the first direction from the data line; a second electrode disposed to face the first electrode; a channel semiconductor overlapping a region between the first electrode and the second electrode; a gate electrode connected to the gate line to overlap the channel semiconductor; a pixel electrode connected to the second electrode; and a target pattern disposed on an extension line connecting a center of the pixel electrode and a portion of the first electrode extending along the first direction.

The target pattern may be disposed in a pixel area occupied by the pixel electrode.

The target pattern may be an island shaped floating pattern that is insulated from any other conductor.

The target pattern may have a size of 6 μm or less along the first direction and 6 μm or less along the second direction.

The target pattern may be formed of the same material and formed at the same time as the gate line and the gate electrode, and is physically and electrically insulated from the gate line and the gate electrode.

The target pattern may be insulated from any other conductor.

The pixel electrode may include a horizontal stem portion, a vertical stem portion, a plurality of fine branch portions connected to the horizontal stem portion or the vertical stem portion, and a connector connected to the second electrode, and a target pattern may overlap a fine slit formed by adjacent fine branch portions that are directly connected to the connector among the fine branch portions.

The target pattern partially may the adjacent fine branch portions that are directly connected to the connector.

The adjacent fine branch portions that are directly connected to the connector may be disposed between the connector and the vertical stem portion.

The display device may further include a light blocking member covering the gate line, the data line, the gate electrode, the first electrode, the second electrode, and the channel semiconductor, and the target pattern may be spaced by a predetermined distance apart from the light blocking member along the first direction and the second direction in a plan view.

According to the exemplary embodiments of the present inventive concept, it is possible to accurately recognize the repair point of the defective pixel by using the target pattern included in each of the pixels.

DETAILED DESCRIPTION

Figure 1:
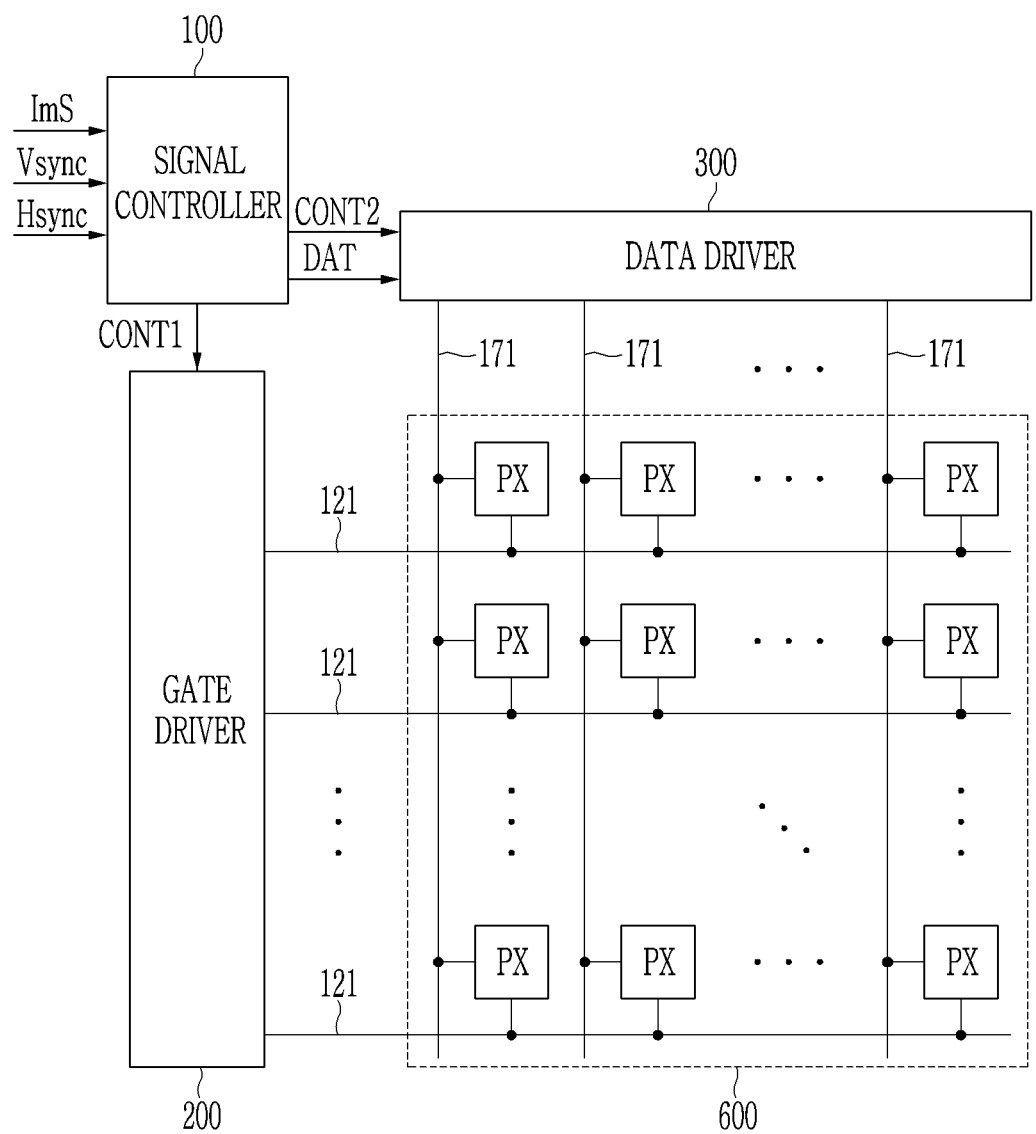
FIG. 1 illustrates schematic block diagram showing a display device according to an exemplary embodiment of the present inventive concept.

Embodiments of the present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thicknesses of layers, films, panels, regions, etc., are enlarged for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

A display device according to an exemplary embodiment will now be described with reference to FIG. 1.

FIG. 1 illustrates schematic block diagram showing a display device according to an exemplary embodiment of the present inventive concept.

Referring to FIG. 1, the display device includes a signal controller 100, a gate driver 200 and a data driver 300 disposed on a peripheral area, and a display area 600. The display device may be a liquid crystal display, and the liquid crystal display may further include a backlight for emitting light toward the display area 600.

The signal controller 100 receives an input image signal ImS and a synchronization signal that are inputted from an external device. The input image signal ImS includes luminance information of a plurality of pixels disposed in the display area 600. Luminance may have a predetermined number of gray levels. The synchronization signal may include a horizontal synchronizing signal Hsync, a vertical synchronization signal Vsync, and the like.

The signal controller 100 generates a first driving control signal CONT1 and a second driving control signal CONT2, and an image data signal DAT depending on the input image signal ImS and the synchronization signal.

The signal controller 100 may divide the input image signal ImS in units of frames depending on the vertical synchronization signal Vsync and may divide the input image signal ImS in units of gate lines depending on the horizontal synchronization signal Hsync to generate the image data signal DAT. The signal controller 100 transfers the first driving control signal CONT1 to the gate driver 200. The signal controller 100 transfers the second driving control signal CONT2 and the image data signal DAT to the data driver 300.

The display area 600 including a plurality of pixels PX. The display area 600 includes the pixels PX, a plurality of gate lines 121, and a plurality of data lines 171. The pixels PX are connected to the gate lines 121 and the data lines 171. Each of the pixels PX may include a target pattern (see FIG. 2). The target pattern 135 will be described later with reference to FIG. 2 and FIG. 3.

The gate lines 121 may extend substantially in a row direction to be substantially parallel to each other. The data lines 171 may extend substantially in a column direction to be substantially parallel to each other. The row direction may be a first direction DR1 (see FIG. 2) or a horizontal direction in a plan view, and the column direction may be a second direction DR2 (see FIG. 2) or a vertical direction in a plan view. The second direction DR2 may be a direction intersecting the first direction DR1 and may be perpendicular to the first direction DR1. "In a plan view" is related to a plane that is parallel to the first direction DR1 and the second direction DR2, and "in a cross-sectional view" is related to a cross-section taken along a third direction DR3 (see FIG. 3) that is perpendicular to the first direction DR1 and the second direction DR2.

The display area 600 may further include a plurality of storage electrode lines 131 (see FIG. 2) extending substantially in the row direction.

Each of the pixels PX may emit one of primary colors. An example of the primary colors may include three primary colors of red, green, and blue, and a desired color may be displayed as a spatial sum or a temporal sum of these three primary colors. A color may be displayed by a red pixel, a green pixel, and a blue pixel. The red pixel, the green pixel, and the blue pixel may be collectively referred to as one pixel.

The gate driver 200 is connected to the gate lines 121. The gate driver 200 may generate a plurality of gate signals in response to the first driving control signal CONT1 and may sequentially apply the gate signals having a gate-on voltage to the gate lines 121. The gate driver 200 may be directly formed in a peripheral area together with an electrical element such as a transistor in the display area using the same process. The peripheral area may be an area surrounding the display area in which the pixels PX are disposed on the substrate. According to an exemplary embodiment, the gate driver 200 may be mounted on a flexible printed circuit film or printed circuit board that is electrically connected to the substrate.

The data driver 300 is connected to the data lines 171. The data driver 300 samples and holds the image data signal DAT in response to the second driving control signal CONT2 and applies the data voltage to the data lines 171. The data driver 300 may apply the data voltage corresponding to the image data signal DAT to the data lines 171 in synchronization with a turn on time of each of the gate signals. The data driver 300 may be directly mounted on the peripheral area of the substrate as a plurality of driving chips or may be mounted on a flexible printed circuit film or a printed circuit board that is electrically connected to the substrate.

Hereinafter, a structure of a display device will be described in more detail with reference to FIG. 2 and FIG. 3.

Figure 2:
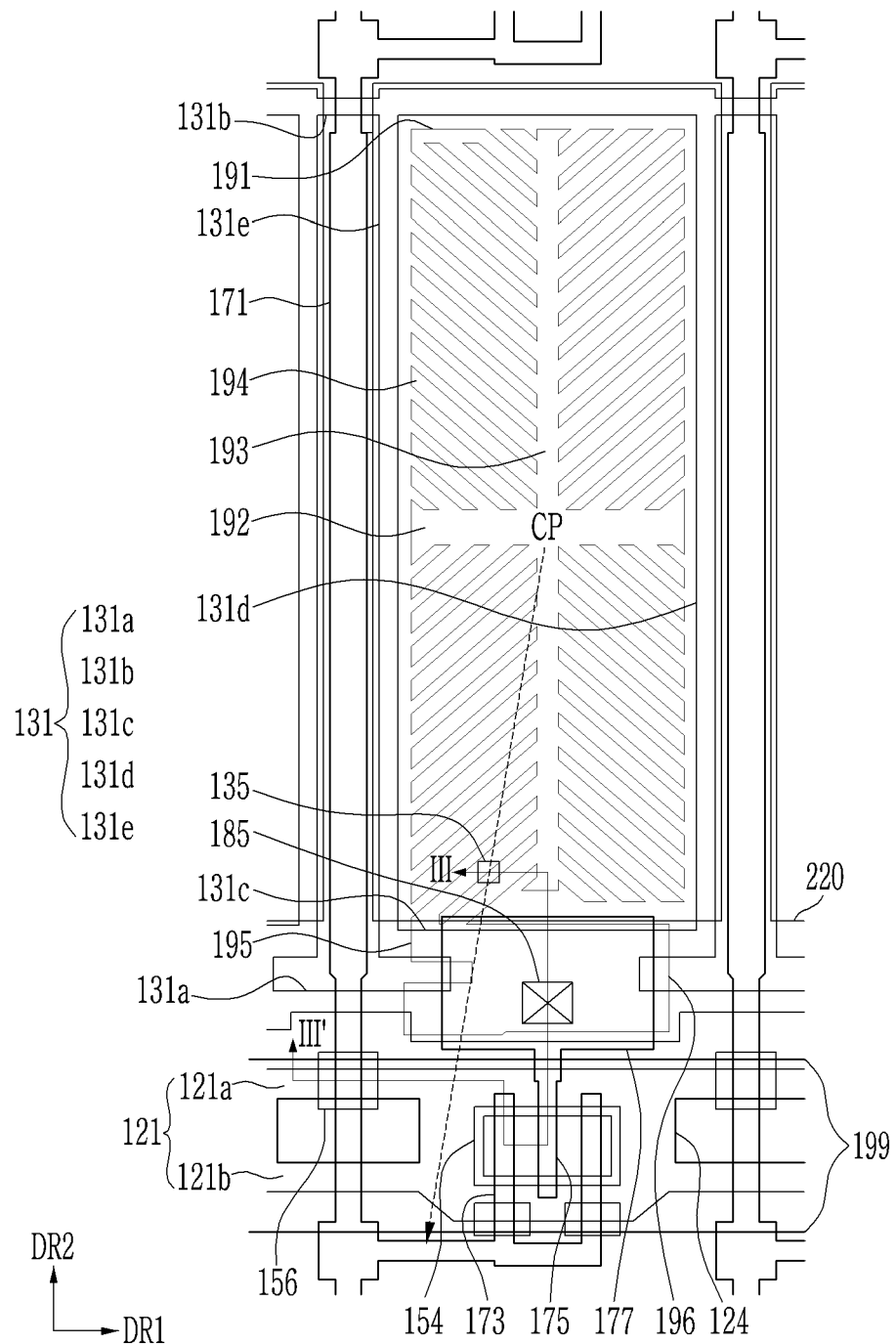
FIG. 2 illustrates a top plan view of a pixel of a display device according to an exemplary embodiment of the present inventive concept.

FIG. 2 illustrates a top plan view of a pixel of a display device according to an exemplary embodiment of the present inventive concept. FIG. 3 illustrates a cross-sectional view showing a cross-section of the display device taken along a line III-III' of FIG. 2.

Figure 3:
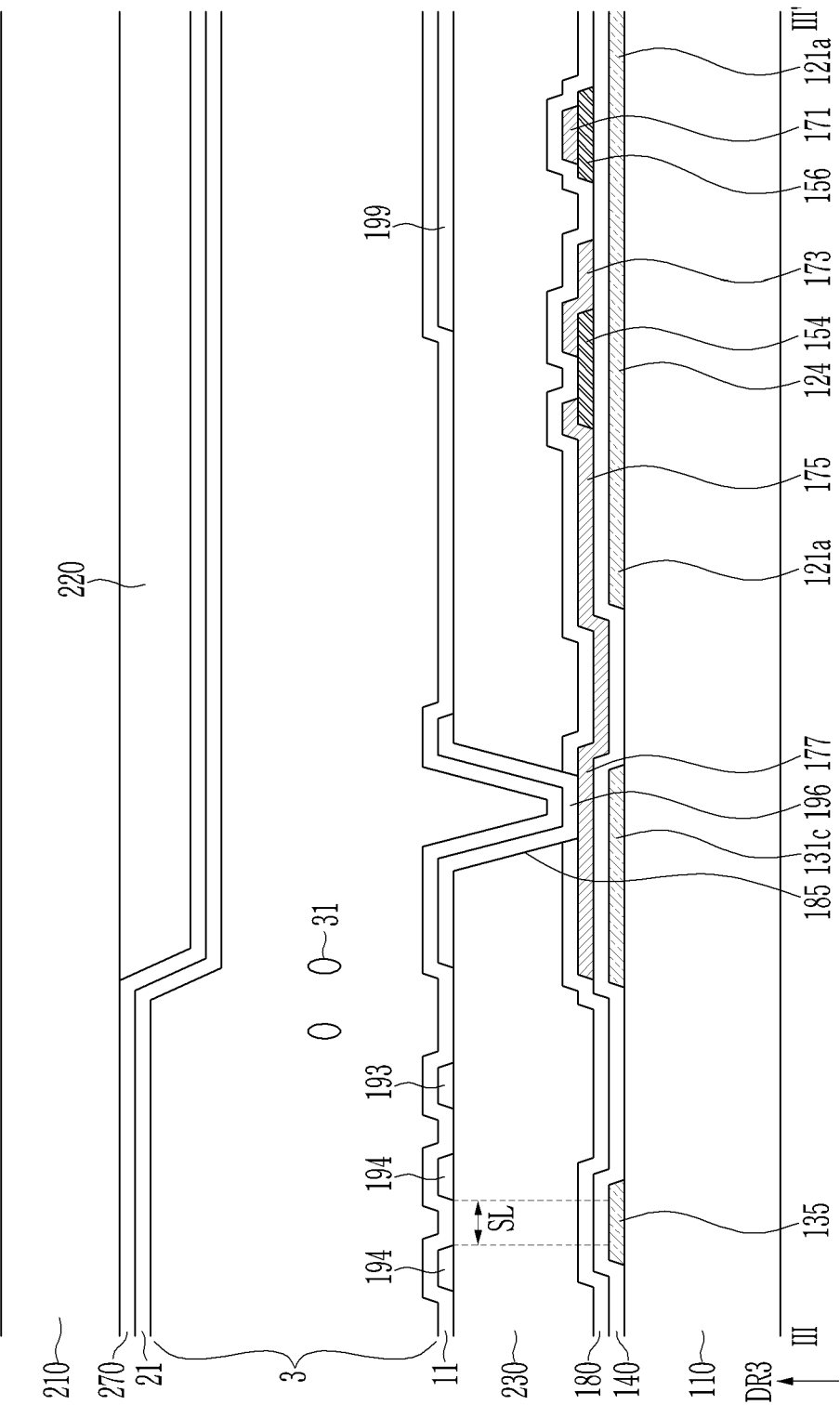
FIG. 3 illustrates a cross-sectional view showing a cross-section of the display device taken along a line III-III' of FIG. 2.

Referring to FIG. 2 and FIG. 3, the display device includes a first substrate 110, a second substrate 210, and a liquid crystal layer 3 disposed between the first substrate 110 and the second substrate 210.

A gate conductive layer including a gate line 121, a gate electrode 124, a storage electrode line 131, and a target pattern 135 is disposed on the first substrate 110. The gate conductive layer may include a metal such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), or tantalum (Ta), or an alloy thereof.

The gate line 121 may include a first gate line 121a and a second gate line 121b. The first gate line 121a and the second gate line 121b may extend in parallel along the first direction DR1. The gate electrode 124 may disposed between the first gate line 121a and the second gate line 121b. The gate electrode 124 is connected to the first gate line 121a and the second gate line 121b.

The storage electrode line 131 is physically separated from the gate line 121 and the gate electrode 124. The storage electrode line 131 may transfer a constant voltage such as a common voltage. The storage electrode line 131 may be disposed on the first substrate 110 and may be formed at the same layer and the same time using a same material as the gate line 121. The storage electrode line 131 may generally extend in the first direction DR1 in parallel with the gate line 121.

The storage electrode line 131 may include a first horizontal portion 131a, a second horizontal portion 131b, an extension 131c, a first vertical portion 131d, and a second vertical portion 131e. The first horizontal portion 131a may extend in the first direction DR1 to be adjacent to a lower side of the pixel electrode 191 in a plan view. The first horizontal portion 131a may be disposed between the gate line 121 and the pixel electrode 191 in a plan view. The second horizontal portion 131b may extend in the first direction DR1 to be adjacent to an upper side of the pixel electrode 191 in a plan view. The expansion 131c is a portion of the first horizontal portion 131a which is expanded in a plan view. The extension 131c is a portion of the first horizontal portion 131a which is extended toward the second horizontal portion 131b, and may be included in the first horizontal portion 131a. The first vertical portion 131d and the second vertical portion 131e are portions connecting the extension portion 131c and the second horizontal portion 131b, and may extend in the second direction DR2. The first vertical portion 131d may be disposed adjacent to a right side of the pixel electrode 191 in a plan view, and the second vertical portion 131e may be disposed adjacent to a left side of the pixel electrode 191 in a plan view. As such, the storage electrode line 131 may be disposed to surround the pixel electrode 191 in a plan view. A constant voltage, such as a common voltage, may be applied to at least one of the first horizontal portion 131a and the second horizontal portion 131b of the storage electrode line 131 from outside the display area.

A gate insulating layer 140 is disposed on the gate conductive layer. The gate insulating layer 140 may include an inorganic insulating material such as a silicon nitride ($SiN_x$), a silicon oxide ($SiO_x$), or the like.

A semiconductor layer including a channel semiconductor 154 and a step blocking semiconductor 156 is disposed on the gate insulating layer 140. The semiconductor layer may include amorphous silicon, polysilicon, or an oxide semiconductor. The channel semiconductor 154 may overlap the gate electrode 124.

A data conductive layer including a data line 171, a first electrode 173, and a second electrode 175 is disposed on the gate insulating layer 140 and the semiconductor layer. The first electrode 173 may be referred to as a source electrode and the second electrode 175 may be referred to as a drain electrode. The data conductive layer may include a metal such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), or tantalum (Ta), or an alloy thereof.

The data line 171 may extend in the second direction DR2 between the first vertical portion 131d and the second vertical portion 131e of the storage electrode line 131 which are adjacent to each other. The data line 171 may extend in the second direction DR2 to intersect the gate line 121 and the first horizontal portion 131a and the second horizontal portion 131b of the storage electrode line 131. The data line 171 may include the first electrode 173. The first electrode 173 may have an extension extended form from the data line 171. For example, the first electrode 173 may have a first portion extending from the data line 171 along a first direction and a second portion connected to an end of the first portion, having a substantially U shape and extending from the end of the first portion toward the gate electrode 124. However, a shape of the first electrode 173 may be variously formed, but is not limited to the above shape.

The step blocking semiconductor 156 may be disposed at a portion where the gate conductive layer and the data line 171 intersect. The step blocking semiconductor 156 may serve to prevent the data line 171 from being disconnected due to a step caused by the gate conductive layer.

The second electrode 175 is physically separated from the data line 171 and the first electrode 173. The second electrode 175 may include a portion facing the first electrode 173 and disposed in an area overlapping the gate electrode 124 and an extension 177. A region between the first electrode 173 and the second electrode 175 facing each other may overlap the channel semiconductor 154. The extension 177, which is a portion extended to overlap the storage electrode line 131, may overlap the expansion 131c of the storage electrode line 131. The extension 177 may overlap the extension 131c of the storage electrode line 131 with the gate insulating layer 140 disposed therebetween to form a storage capacitor. The storage capacitor may serve to maintain a voltage applied to the second electrode 175 and the pixel electrode 191 connected thereto even when a data voltage is not applied from the data line 171 to the second electrode 175 and the pixel electrode 191.

The gate electrode 124, the first electrode 173, and the second electrode 175 may constitute a transistor as a switching element together with the channel semiconductor 154. A channel of the transistor may be formed in the channel semiconductor 154 between the first electrode 173 and the second electrode 175.

A passivation layer 180 is disposed on the data conductive layer and the exposed semiconductor layer. The passivation layer 180 may include an inorganic insulating material such as a silicon nitride ($SiN_x$), a silicon oxide ($SiO_x$), or the like.

A color filter layer 230 may be disposed on the passivation layer 180. The color filter layer 230 may include an inorganic insulating material or an organic insulating material. The color filter layer 230 may represent one of the primary colors.

The passivation layer 180 and the color filter layer 230 may have a contact opening 185 exposing the extension 177 of the second electrode 175.

A pixel electrode layer including a pixel electrode 191 and a shielding electrode 199 may be disposed on the color filter layer 230. The pixel electrode layer may include a transparent conductive material such as an indium tin oxide (ITO) or an indium zinc oxide (IZO), or a metal such as aluminum (Al), silver (Ag), or chromium (Cr), or an alloy thereof. The pixel electrode 191 may be physically and electrically connected to the second electrode 175 through the contact opening 185 to receive a data voltage from the second electrode 175.

The pixel electrode 191 may correspond to a pixel area where one pixel displays an image, and an overall shape of the pixel electrode 191 may be a quadrangle. The pixel area may correspond to an area that is generally occupied by the pixel electrode 191. The pixel electrode 191 may have a horizontal stem portion 192, a vertical stem portion 193, a plurality of fine branch portions 194, a connector 195, and an extension 196.

The horizontal stem portion 192 may extend in the first direction DR1, the vertical stem portion 193 may extend in the second direction DR2, and the horizontal stem portion 192 and the vertical stem portion 193 may form a cross. The pixel electrode 191 may include four subareas defined by the horizontal stem portion 192 and the vertical stem portion 193, and the fine branch portions 194 connected to the horizontal stem portion 192 or the vertical stem portion 193. The fine branch portions 194 may be disposed in each of the subareas.

The fine branch portions 194 may form an angle of approximately 40 degrees to 45 degrees with the horizontal stem portion 192. The fine branch portions 194 of two adjacent subareas may be perpendicular to each other. Pixel electrode layer disposed between neighboring fine branch portions 194 may be removed to form fine slits SL.

The connector 195 may be connected to at least one of the fine branch portions 194 included in one subarea. As illustrated, the connector 195 may be connected to the two fine branch portions 194.

The extension 196 of the pixel electrode 191 is a portion extended from the connector 195 to overlap the extension 177 of the second electrode 175. The extension 196 of the pixel electrode 191 may be physically and electrically connected to the second electrode 175 through the contact opening 185.

As illustrated in FIG. 2, end portions of left and right edges of the pixel electrode 191 may not overlap the first vertical portion 131d and the second vertical portion 131e of the storage electrode line 131. Alternatively, according to an exemplary embodiment, the end portions of the left and right edges of the pixel electrode 191 may overlap at least one of the first vertical portion 131d and the second vertical portion 131e of the storage electrode line 131.

The shielding electrode 199 may be spaced apart from the pixel electrode 191 and may generally extend along the first direction DR1. The shielding electrode 199 may overlap the gate line 121. The shielding electrode 199 may receive a same voltage as that of the common electrode 270. An electric field is not generated between the shielding electrode 199 and the common electrode 270, thus, a liquid crystal disposed between the shielding electrode 199 and the common electrode 270 may be arranged not to pass through light from a light source. As such, the liquid crystal molecules themselves may function as a light blocking member. According to an exemplary embodiment, the shielding electrode 199 may be omitted.

A light blocking member 220 may be disposed below the second substrate 210. The light blocking member 220 may prevent light leakage between neighboring pixel electrodes 191. In particular, the light blocking member 220 may be mainly disposed in a region between adjacent pixel electrodes 191 in a plan view. For example, the light blocking member 220 may extend between adjacent pixel electrodes 191 in the first direction DR1 to cover the gate line 121, the first horizontal portion 131a and the extension 131c of the storage electrode line 131, the gate electrode 124, the channel semiconductor 154, the first electrode 173, the second electrode 175, etc., and may extend in the second direction DR2 between neighboring pixel electrodes 191 to cover the data line 171. The light blocking member 220 may have a mesh form in a plan view and a pixel area of the pixels PX may be exposed by the light blocking member 220. That is, a plurality of openings formed by the mesh-type light blocking member 220 may correspond to the pixel area of the pixels PX.

The target pattern 135 is physically and electrically insulated from the gate line 121, the gate electrode 124, and the storage electrode line 131. The target pattern 135 may be disposed on a pixel area in which one pixel displays an image in a plan view. The target pattern 135 may be spaced apart from the light blocking member 220 by a predetermined distance in the first direction DR1 and the second direction DR2 in a plan view.

The target pattern 135 may have an island form which is floated from any other conductors. That is, the target pattern 135 is not electrically connected to any other conductors but is insulated from the other conductors, and no voltage is applied to the target pattern 135.

The target pattern 135 may be disposed in any one of four subareas that are defined by the horizontal stem portion 192 and the vertical stem portion 193 of the pixel electrode 191. The target pattern 135 may be dispose in a subarea in which at least one of the fine branch electrodes is connected to the connector 195. The target pattern 135 may overlap at least one fine slit SL formed between adjacent two fine branch portions 194 disposed between the connector 195 and the vertical stem portion 193. The adjacent two fine branch portions 194 are directly connected to the connector 195. The target pattern 135 may partially overlap the fine branch portion 194 positioned between the connector 195 and the vertical stem portion 193 of the pixel electrode 191. That is, the target pattern 135 may partially overlap the fine branch portion 194 that is directly connected to the connector 195. The target pattern 135 may be recognized through the at least one fine slit SL in a plan view.

The target pattern 135 may have a minimum size that can be formed in a manufacturing process of the display device to maximize an aperture ratio of the pixel. For example, the target pattern 135 may have a size of 6 μm or less in the first direction DR1 and 6 μm or less in the second direction DR2.

By using the target pattern 135, a repair point of each of the pixels PX may be recognized. A defective pixel that emits light with abnormally bright luminance may occur due to a short circuit between wires among the pixels PX. A display defect, such as a bright spot being visibly recognized by the defective pixel, may occur due to the short circuit.

The fine branch portion 194 overlapping the target pattern 135 may be irradiated with a laser to electrically disconnecting the pixel electrode 191 and the data line 171 to repair a defective pixel. Since the fine branch portion 194 overlapping the target pattern 135 is a portion electrically connecting the second electrode 175 to the pixel electrode 191, the pixel electrode 191 may be physically and electrically separated from the second electrode 175 by cutting the fine branch portion 194 overlapping the target pattern 135. The data voltage may not be applied to the pixel electrode 191 that is physically and electrically separated from the second electrode 175 by laser cutting process, an electric field may not be generated between the pixel electrode 191 and the common electrode 270, and a liquid crystal disposed between the pixel electrode 191 and the common electrode 270 may be in a black state. It is possible to improve the display defect by causing the defective pixel that emit light with abnormally bright luminance to always display black.

A repair point for separating the first electrode 173 from the data line 171 may be found by using a center CP of the pixel electrode 191 and a center of the target pattern 135. The center CP of the pixel electrode 191 may be a point where the horizontal stem portion 192 and the vertical stem portion 193 intersect each other. A portion of the first electrode 173 intersecting an imaginary line that connects the center CP of the pixel electrode 191 and the center of the target pattern 135 may be the repair point for separating the first electrode 173 from the data line 171. That is, the portion of the first electrode 173 extending in the first direction DR1 from the data line 171 may be disposed on an extension line connecting the center CP of the pixel electrode 191 and the center of the target pattern 135. In other words, the target pattern 135 may be disposed on an extension line connecting the center CP of the pixel electrode 191 and the repair point for separating the first electrode 173 from the data line 171. A portion of the first electrode 173 disposed on the extension line connecting the center CP of the pixel electrode 191 and the center of the target pattern 135 becomes a repair point. As such, the target pattern 135 may be helpful when finding the repair point of the first electrode 173.

The first electrode 173 is not visible because it is disposed under the light blocking member 220. However, the repair point of the first electrode 173 may be found by using the center CP of the pixel electrode 191 and the center of the target pattern 135. The repair point of the first electrode 173 may be irradiated with a laser to physically and electrically separate the first electrode 173 from the data line 171. When the first electrode 173 of the defective pixel is physically and electrically separated from the data line 171, the data voltage is not applied to the pixel electrode 191 of the defective pixel, and the defective pixel always displays black. It is possible to improve the display defect by causing the defective pixel that emit light with abnormal luminance to always display black.

A common electrode 270 may be disposed below the light blocking member 220. The common electrode 270 may be continuously formed in most of a region corresponding to the display area. The common electrode 270 may include a transparent conductive material such as ITO and IZO, or a metal such as aluminum (Al), silver (Ag), or chromium (Cr), or an alloy thereof. According to an exemplary embodiment, the common electrode 270 may be patterned to include a slit or a cutout.

Previously, it was described that the color filter layer 230 is disposed on the first substrate 110, but according to an exemplary embodiment, the color filter layer 230 may not be disposed on the first substrate 110, but may be disposed between the second substrate 210 and the common electrode 270.

The liquid crystal layer 3 may include liquid crystal molecules 31 having negative dielectric anisotropy. The liquid crystal molecules 31 may be oriented such that their long axes are generally perpendicular to or are inclined at a predetermined angle with respect to the perpendicular direction to surfaces of the first substrate 110 and the second substrate 210 in the absence of an electric field in the liquid crystal layer 3. The liquid crystal molecules 31 may be pre-tilted depending on a fringe field or step between an edge of patterned portions (e.g., the fine branch portion 194) of the pixel electrode 191 and the common electrode 270.

A first alignment layer 11 may be disposed on the pixel electrode 191 and the color filter layer 230, and a second alignment layer 21 may be disposed below the common electrode 270. The first alignment layer 11 and the second alignment layer 21 may be a vertical alignment layer. The liquid crystal layer 3 is disposed between the first alignment layer 11 and the second alignment layer 21. A plurality of polymer protrusions formed by reacting reactive monomers RM to react with light such as ultraviolet rays may be disposed on surfaces of the first alignment layer 11 and the second alignment layer 21 which are adjacent to the liquid crystal layer 3. Such polymer protrusions may function to maintain the pre-tilt of the liquid crystal molecules 31 of the liquid crystal layer 3.

The pixel electrode 191 to which the data voltage is applied generates an electric field together with the common electrode 270. An arrangement direction of the liquid crystal molecules 31 disposed between the pixel electrode 191 and the common electrode 270 may be determined by the electric field, and luminance of light passing through the liquid crystal layer 3 may be controlled depending on the determined direction of the liquid crystal molecules 31.

Hereinafter, a pixel according to another exemplary embodiment will be described with reference to FIG. 4 and FIG. 5. Differences from the aforementioned exemplary embodiment of FIG. 2 and FIG. 3 will be mainly described.

Figure 4:
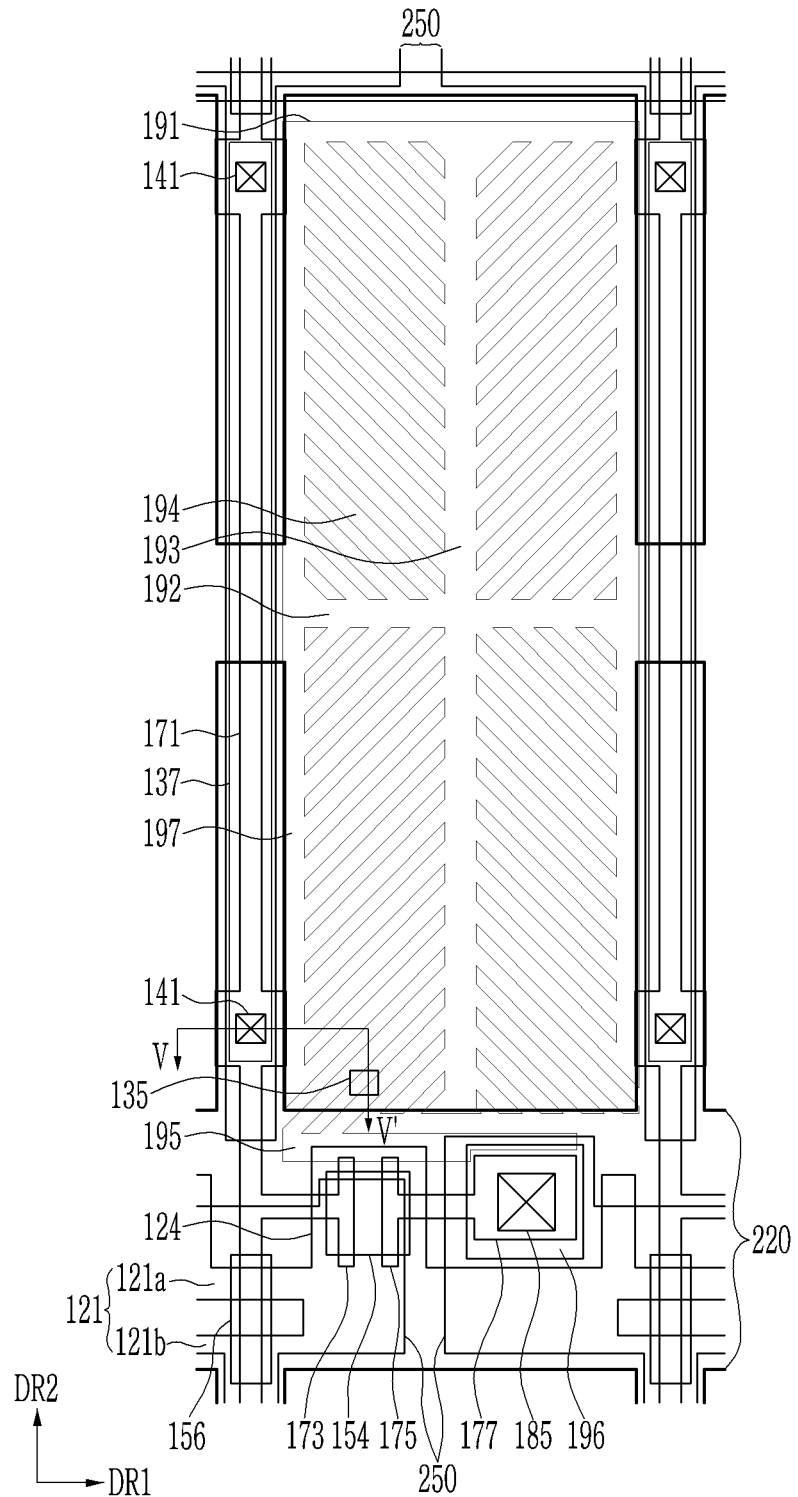
FIG. 4 illustrates a top plan view of a pixel according to an exemplary embodiment of the present inventive concept.

FIG. 4 illustrates a top plan view of a pixel according to an exemplary embodiment of the present inventive concept. FIG. 5 illustrates a cross-sectional view showing a cross-section of the display device taken along a line V-V' of FIG. 4.

Figure 5:
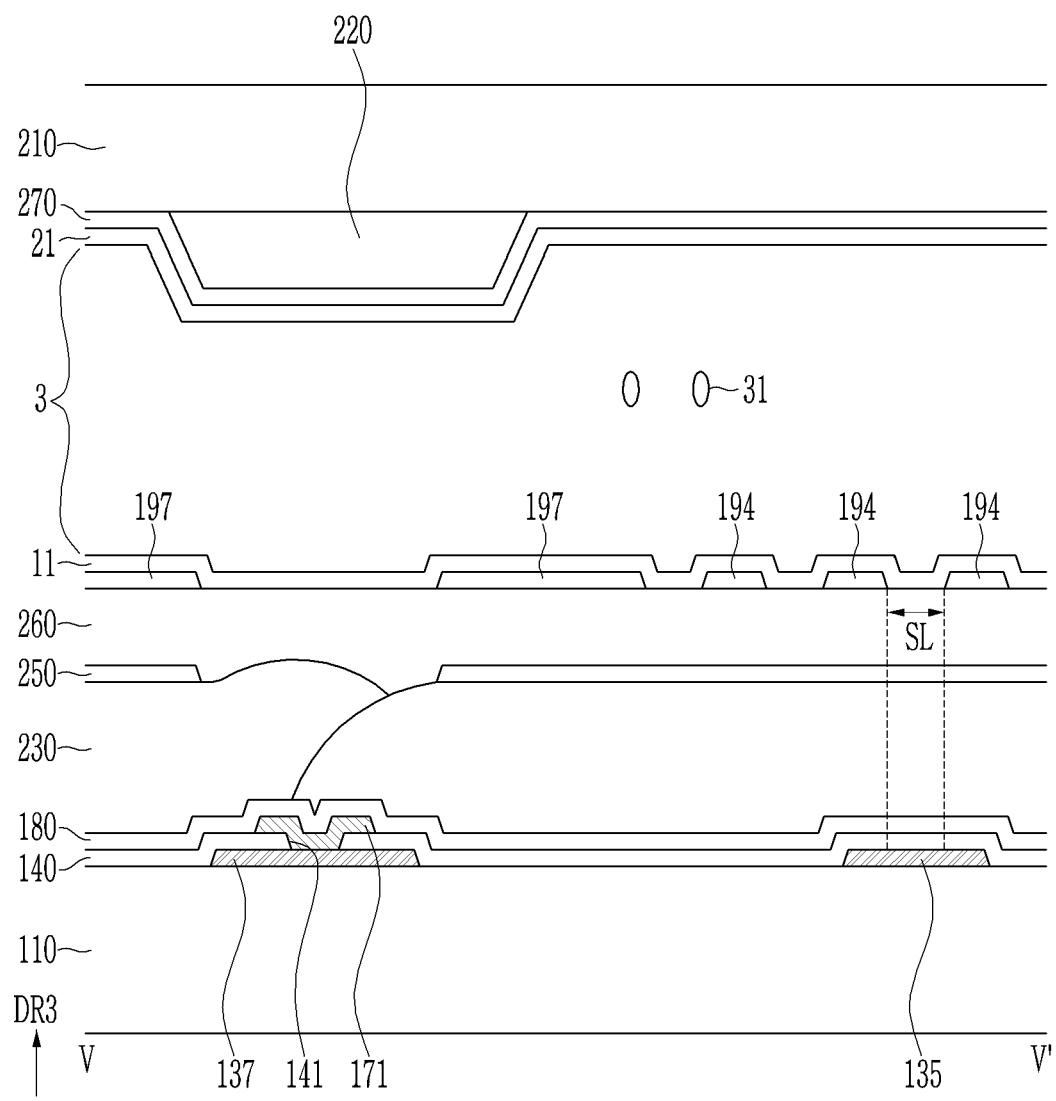
FIG. 5 illustrates a cross-sectional view showing a cross-section of the display device taken along a line V-V' of FIG. 4.

Referring to FIG. 4 and FIG. 5, a gate conductive layer including a gate line 121, a gate electrode 124, a target pattern 135, and an auxiliary data pattern 137 is disposed on the first substrate 110. That is, the gate conductive layer does not include the storage electrode line 131, but includes the auxiliary data pattern 137.

The auxiliary data pattern 137 extends in the second direction DR2 not to contact the gate line 121 between the pixel electrodes 191 which are adjacent in the first direction DR1. The auxiliary data pattern 137 is physically separated from the gate line 121 and the gate electrode 124. The auxiliary data pattern 137 may be formed at a same layer by using a same material as the gate line 121. The auxiliary data pattern 137 overlaps the data line 171.

The gate insulating layer 140 disposed on the gate conductive layer has a contact opening 141. The contact opening 141 may be formed at a position overlapping a first end of the auxiliary data pattern 137 and at a position overlapping a second end thereof.

The data line 171 disposed on the gate insulating layer 140 may contact the auxiliary data pattern 137 through the contact opening 141. The auxiliary data pattern 137 may be electrically connected to the data line 171 and may serve to transmit a data voltage. The auxiliary data pattern 137 may serve to reduce resistance of the data line 171.

The first electrode 173 may have a bar shaped first portion extending from the data line 171 parallel to the extending direction of the gate line 121 and a bar shaped second portion connected to an end of the bar shaped first portion and extending in the second direction DR2. The second electrode 175 may be formed to have a bar shaped first portion extending along a first direction and a bar shaped second portion connected to one end of the bar shaped first portion of the second electrode 175 and extending along the second direction to face the bar shaped second portion of the first electrode 173 and an extension 177. The extension 177 may overlap the contact opening 185 for connecting the pixel electrode 191 and a transistor.

An intermediate conductive layer 250 may be disposed on the color filter layer 230

The intermediate conductive layer 250 may overlap the pixels PX, and may be patterned generally not to overlap the data line 171 and the transistor while overlapping the pixel electrode. The intermediate conductive layer 250 may not overlap the auxiliary data pattern 137. The intermediate conductive layer 250 may not overlap the first electrode 173, the second electrode 175, and the extension 177 of the second electrode 175. A common voltage or a predetermined reference voltage may be applied to the intermediate conductive layer 250. The intermediate conductive layer 250 overlaps the pixel electrode 191 to constitute a holding capacitor. The intermediate conductive layer 250 may include a metal such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), or tantalum (Ta), or an alloy thereof.

An insulating layer 260 may be disposed on the intermediate conductive layer 250. The insulating layer 260 may include an organic insulating material. The passivation layer 180, the color filter layer 230, and the insulating layer 260 may have a contact opening 185 disposed on the extension 177.

A pixel electrode layer including a pixel electrode 191 may be disposed on the insulating layer 260.

The pixel electrode 191 may include a horizontal stem portion 192, a vertical stem portion 193, a plurality of fine branch portions 194, a connector 195, an extension 196, and an edge portion 197. The edge portion 197 may be connected to the fine branch portions 194 along an edge of the pixel electrode 191.

The light blocking member 220 disposed under the second substrate 210 may cover the gate line 121 and the transistor between neighboring pixel electrodes 191, and may generally extend in the first direction DR1. The light blocking member 220 may protrude in the second direction DR2 from a portion overlapping the data line 171 to cover a portion of the data line 171.

Except for these differences, features of the exemplary embodiment described with reference to FIG. 2 and FIG. 3 may be applied to the exemplary embodiment described with reference to FIG. 4 and FIG. 5. In particular, the target pattern 135 described in the exemplary embodiment of FIG. 2 and FIG. 3 may be applied to the pixels according to the exemplary embodiment of FIG. 4 and FIG. 5, and duplicate descriptions thereof will be omitted.

While exemplary embodiments of the present inventive concept have been particularly shown and described with reference to the accompanying drawings, the specific terms used herein are only for the purpose of describing the inventive concept and are not intended to define the meanings thereof or be limiting of the scope of the inventive concept set forth in the claims. Therefore, those skilled in the art will understand that various modifications and other equivalent embodiments of the present inventive concept are possible. Consequently, the true technical protective scope of the present inventive concept must be determined based on the technical spirit of the appended claims.

What is claimed is:

1. A display device comprising:
    a plurality of gate lines;
    a plurality of data lines; and
    a plurality of pixels connected to the plurality of gate lines and the plurality of data lines,
    wherein each of the plurality of pixels includes:
    a transistor including a gate electrode, a first electrode, a second electrode, and a channel semiconductor;
    a pixel electrode connected to the second electrode, the pixel electrode including a horizontal stem portion, a vertical stem portion, a plurality of fine branch portions connected to the vertical stem portion and extending from the vertical stem portion obliquely, and a connector connected to the second electrode; and
    a target pattern overlapping a fine slit disposed between a first fine branch portion and a second fine branch portion of the plurality of fine branch portions, the first fine branch portion and the second fine branch portion being adjacent to each other, parallel to each other, and extending obliquely from the vertical stem portion,
    wherein the connector is spaced from the vertical stem portion, is not directly connected to the vertical stem portion, and overlaps a light blocking member, wherein the fine slit extends from the vertical stem portion towards the connector, wherein at least one of the first fine branch portion and the second fine branch portions is directly connected to the connector, wherein the target pattern does not overlap a center of the pixel electrode, and wherein the target pattern is a floating pattern that is insulated from any other conductor.

2. The display device of claim 1, wherein the target pattern partially overlaps the adjacent fine branch portions that are directly connected to the connector.

3. The display device of claim 1, wherein the target pattern is disposed at a same layer as the plurality of gate lines and the gate electrode, and is physically and electrically separated from the plurality of gate lines and the gate electrode.

4. The display device of claim 1, wherein the target pattern has a size of 6 μm or less along a first direction and 6 μm or less along a second direction.

5. The display device of claim 1, wherein the target pattern is exposed by the fine slit in a plan view.

6. The display device of claim 1,
wherein the adjacent fine branch portions that are directly connected to the connector are disposed between the connector and the vertical stem portion.

7. The display device of claim 1, further comprising a light blocking member covering the plurality of gate lines, the plurality of data lines, the gate electrode, the first electrode, the second electrode, and the channel semiconductor,
wherein the target pattern is disposed in a pixel area defined by the light blocking member.

8. The display device of claim 7, wherein the target pattern is spaced by a predetermined distance apart from the light blocking member along a first direction and a second direction in a plan view.

9. The display device of claim 1, wherein a portion of the first electrode extends from a data line along a first direction, and the target pattern is disposed on an extension line connecting a center of the pixel electrode and a portion of the first electrode.

10. A display device comprising:
a gate line extending along a first direction;
a data line extending along a second direction;
a first electrode including a portion extending along the first direction from the data line;
a second electrode disposed to face the first electrode;
a channel semiconductor overlapping a region between the first electrode and the second electrode;
a gate electrode connected to the gate line to overlap the channel semiconductor;
a pixel electrode connected to the second electrode; and
a target pattern disposed on an extension line connecting a center of the pixel electrode and a portion of the first electrode extending along the first direction,
wherein the target pattern is a floating pattern that is insulated from any other conductor, and
wherein the target pattern does not overlap a center of the pixel electrode, and an entirety of the target pattern is closer to an edge of the pixel electrode than to the center of the pixel electrode.

11. The display device of claim 10, wherein the target pattern is disposed in a pixel area occupied by the pixel electrode.

12. The display device of claim 11, wherein the target pattern has a size of 6 μm or less along the first direction and 6 μm or less along the second direction.

13. The display device of claim 10, wherein the target pattern is formed of the same material and formed at the same time as the gate line and the gate electrode, and is physically and electrically insulated from the gate line and the gate electrode.

14. The display device of claim 10, wherein the pixel electrode includes a horizontal stem portion, a vertical stem portion, the plurality of fine branch portions connected to the horizontal stem portion or the vertical stem portion, and a connector connected to the second electrode, and the target pattern overlaps the fine slit disposed between the adjacent fine branch portions that are directly connected to the connector among the fine branch portions.

15. The display device of claim 14, wherein the target pattern partially overlaps the adjacent fine branch portions that are directly connected to the connector.

16. The display device of claim 14, wherein the adjacent fine branch portions that are directly connected to the connector is disposed between the connector and the vertical stem portion.

17. The display device of claim 10, further comprising a light blocking member covering the gate line, the data line, the gate electrode, the first electrode, the second electrode, and the channel semiconductor,
wherein the target pattern is spaced by a predetermined distance apart from the light blocking member along the first direction and the second direction in a plan view.

* * * * *